(12) United States Patent
Trump

(10) Patent No.: US 8,559,896 B2
(45) Date of Patent: Oct. 15, 2013

(54) SYSTEM AND METHOD FOR RADIO POWER LEVEL CONTROL

(75) Inventor: Shauen Thomas Trump, Raleigh, NC (US)

(73) Assignee: Harris Stratex Networks, Inc., Morrisville, NC (US)

(*) Notice: Subject to any disclaimer, the term of this patent is extended or adjusted under 35 U.S.C. 154(b) by 1407 days.

(21) Appl. No.: 11/169,909

(22) Filed: Jun. 30, 2005

(65) Prior Publication Data

US 2007/0004348 A1   Jan. 4, 2007

(51) Int. Cl.
 *H04B 1/04* (2006.01)
(52) U.S. Cl.
 USPC ........................................ 455/114.3; 455/126
(58) Field of Classification Search
 USPC .......... 455/127.1, 127.2, 127.3, 127.4, 127.5, 455/67.11, 78, 522, 83, 126, 69, 114.3; 375/296, 297
 See application file for complete search history.

(56) References Cited

U.S. PATENT DOCUMENTS

| | | | |
|---|---|---|---|
| 4,263,560 A * | 4/1981 | Ricker | 330/129 |
| 4,665,560 A | 5/1987 | Lange | |
| 5,646,578 A * | 7/1997 | Loh et al. | 330/279 |
| 5,687,195 A | 11/1997 | Hwang et al. | |
| 5,732,334 A * | 3/1998 | Miyake | 455/126 |
| 5,920,808 A * | 7/1999 | Jones et al. | 455/127.1 |
| 6,009,324 A * | 12/1999 | Pravitz et al. | 455/423 |
| 6,029,074 A * | 2/2000 | Irvin | 455/571 |
| 6,104,919 A | 8/2000 | Lyall, Jr. et al. | |
| 6,122,331 A | 9/2000 | Dumas | |
| 6,285,863 B1 | 9/2001 | Zhang | |
| 6,324,230 B1 | 11/2001 | Graham et al. | |
| 6,330,455 B1 * | 12/2001 | Ichihara | 455/522 |
| 6,759,902 B2 * | 7/2004 | Kossor | 330/136 |
| 6,836,647 B2 | 12/2004 | Rimini et al. | |
| 7,023,278 B1 * | 4/2006 | Vagher et al. | 330/284 |
| 7,184,721 B2 * | 2/2007 | Asirvatham et al. | 455/115.2 |
| 7,218,951 B2 * | 5/2007 | Rozenblit et al. | 455/522 |
| 7,450,907 B2 * | 11/2008 | Shurvinton et al. | 455/67.11 |
| 2004/0012441 A1* | 1/2004 | Mackey et al. | 330/129 |

* cited by examiner

*Primary Examiner* — Christian Hannon
(74) *Attorney, Agent, or Firm* — Sheppard, Mullin, Richter & Hampton LLP

(57) ABSTRACT

In a system and method for controlling radio power level, an analog amplifier is utilized with a signal feedback loop. A digitally controlled attenuator is utilized in the feedback loop to apply power level control across a range of power levels.

13 Claims, 4 Drawing Sheets

SYSTEM AND METHOD FOR RADIO POWER LEVEL CONTROL

BACKGROUND

Telecommunications radios (including those in the microwave domain), employ several methods to obtain accurate power levels throughout the gain stages of the radio in both the transmit and receive directions. The radio may be calibrated in the factory to accurately set a single power level at which the radio will operate. Alternately, the radio may be dynamically calibrated by a digital system which utilizes tables of calibration data to maintain power levels at various detectors in the data path.

Factory calibrated radios generally use an analog feedback loop to control power levels in the data path. These radios provide a single output power due to the use of analog feedback via one or more feedback loops in the signal path. The analog feedback is able to closely control the power level throughout temperature fluctuations. Analog feedback is desirable for the remote modem receiving the signal because the feedback mechanism can be tuned to provide continuously ramping feedback, thereby allowing the remote modem to adapt as the signal strength changes. The drawback of factory-tuned single power radios is that they can provide only a single power level. However, signal level control from the user or software may be achieved through the use of a digitally controlled attenuator which provides accurate attenuation without calibration. Use of such attenuators, however, often results in a momentary loss of data on the signal path when attenuation is changed.

Digital systems utilize software to control power levels in the signal path via one or more detectors and attenuators. Gain stages are often static as application of attenuation is more exact than control of amplification. The radios often feature only a limited range of closed-loop operation due to the drastic requirements placed on high-power, high-frequency power detectors. Operation outside of this limited range often occurs in an open-loop manner. Applying attenuation under software control introduces inherent difficulties due to the discrete nature of digital control systems. The software of the digital system must be adapted to provide signal path power level control in such a manner that the remote modem receiving the signal does not experience a sudden change in power level which may not be correctable (i.e. applying 1 dB of attenuation to the signal path will cause a sharp edge which may not be distinguished from the edges in a modulated signal). Additionally, the dynamic calibration process itself restricts the detectors and attenuators that may be used in the radio, consumes a significant mount of electronic memory and necessitates potentially complex software to utilize the calibration data.

A prior art wide band automatic gain controller with limiting amplifiers is shown in U.S. Pat. No. 4,665,560. Although this patent appears to be an analog automatic gain control feedback loop controllable via dynamic range bias control, this bias control is not effected by microprocessor/digital control as in the present subject matter.

Prior art U.S. Pat. No. 6,104,919 is directed to an intermodulation distortion reduction circuit utilizing variable attenuation in a dual mode FM/CDMA environment. When variable attenuator circuit 22 is enabled, it is controlled via a temperature compensation circuit 32 through automatic gain control circuit 30, as shown in FIG. 1. Although the figure discloses a feedback loop having an automatic gain control that controls a variable attenuator in the signal path, it does not disclose a digitally controlled attenuator in the feedback path, nor the advantages enumerated hereafter.

U.S. Pat. No. 6,122,331 discloses a system providing digital automatic gain control. This patent attempts to overcome some of the problems described herein by utilizing a delay generator 28 and a transition region detector 25, as shown in FIG. 2. However the digitally controlled automatic gain controller acts on the main signal line and not the feedback loop, and thus is still subject to disruptions introduced by the digital attenuator.

U.S. Pat. No. 6,836,647 discloses a system and method for estimating the power-level of a signal received at a mobile-station receiver operating in a wireless network according to a CDMA standard. The patent discloses using digital automatic gain controllers in closed feedback loops. However, the feedback loops are digital and retain the problems as described above.

U.S. Pat. No. 6,324,230 is directed to a multimode fast attack automatic gain control loop for narrow band receivers. The disclosure describes switching between an analog automatic control loop and a digital automatic control loop. The patent does not disclose the digitally controlled analog feedback loop of the present invention.

The present subject matter implements a radio design combining the continuously ramping feedback and calibration-free operation of an analog feedback system with the accurate power level control across a range of power levels of a digital feedback system. Additionally, the present subject matter offers closed-loop operation across a broad range of power levels, a feature not offered by any of the prior art design types described above.

The present disclosure describes a control system which utilizes a traditional analog feedback loop combined with software control applied to the feedback loop by means of a digitally controlled attenuator. The result is a calibration-free radio design with accurate selectable power levels across any desired power level range.

These and many other objects and advantages of the present invention will be readily apparent to one skilled in the art to which the invention pertains from a perusal of the claims, the appended drawings, and the following detailed description of the preferred embodiments.

DETAILED DESCRIPTION

Figure 1:
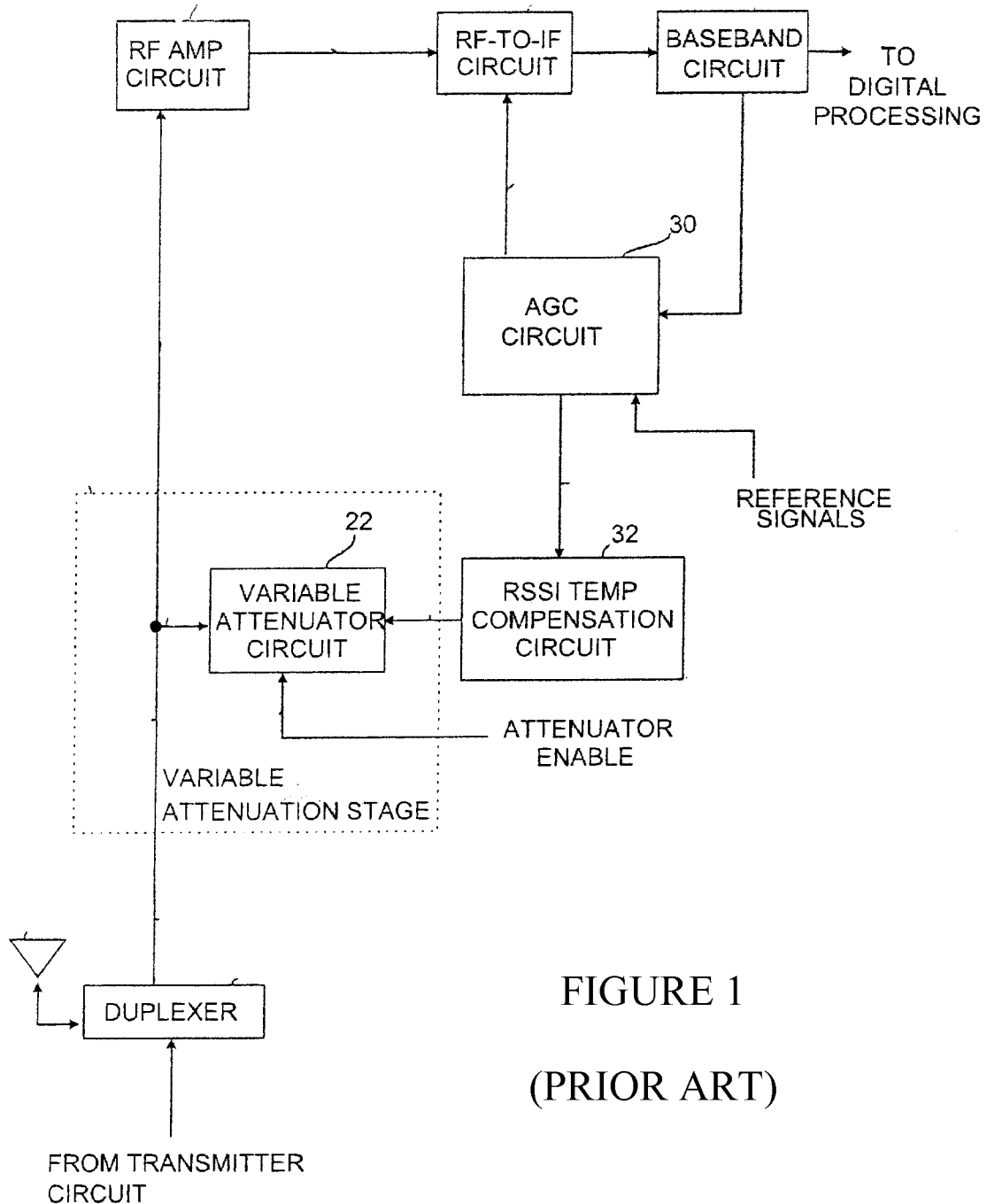
FIG. 1 is a prior art distortion reduction circuit utilizing variable attenuation.
Figure 2:
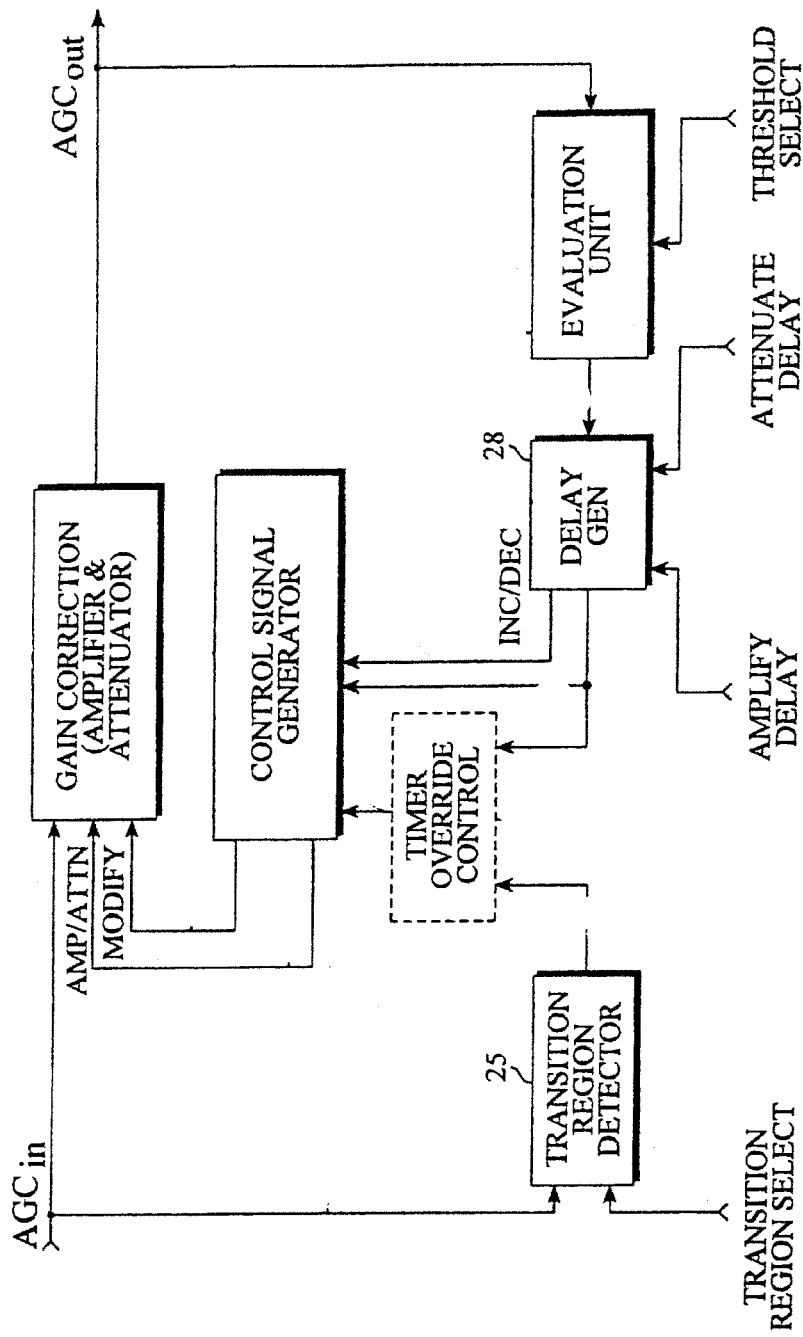
FIG. 2 is a prior art automatic gain control circuit.

In this subject matter the signal path consists of the typical gain stages of an analog power control device such as an attenuator or amplifier. Coupled to the location of the target power reading is the beginning of the feedback loop. The feedback loop consists of first a down converter (high-side mixer or frequency subtractor) which subtracts the supplied radio frequency (the same frequency supplied to the up converter stage) from the signal. This provides a high-power, low-frequency signal to the next stage of the feedback loop. Next in the feedback loop is a digitally controlled attenuator. This device is under software control and is utilized to control the target power level at the point of coupling. Because data does not pass through the feedback path, use of an attenuator provides accurate attenuation without concern for a momentary loss of data.

The loop bandwidth can be tuned to ignore the momentary discontinuity of the digital attenuator when attenuation is applied or removed. At this point in the feedback loop the signal level is both low frequency and low power, which allows the use of less expensive and/or more accurate power detectors and attenuators. Following the digital attenuator in the feedback loop is the temperature compensated power detector. This detector provides an analog voltage to the next stages of the feedback loop. The analog voltage at this point represents the power level at the point of coupling to the signal path. Because the detector is utilized in a feedback system it does not require calibration. The final stages of the feedback loop consist of scaling and integrator blocks providing feedback to the signal path in the form of a voltage level applied to an attenuator (or amplifier) in the data path.

In operation, when the detector output indicates a power level outside the target, the feedback system engages to result in a correction to the power level. By removing attenuation from the digitally controlled attenuator the power level in the data path is reduced. Applying attenuation to the digital attenuator results in a higher power level in the data path. Likewise, because the attenuator (or amplifier) in the data path is controlled via the feedback loop it is also not a calibrated component. Due to the nature of digitally controlled attenuators, there is no calibration required for this component. By carefully establishing the loop bandwidth, the feedback system can be rendered immune to the discontinuity of the digital attenuator as well as providing an effective over-damped feedback to the data path. Such a feedback system could be utilized at each gain stage of the radio to provide ideal IMD3 and spur control by the software. Software algorithms can determine at which gain stage to apply the attenuation resulting in detailed control of the power levels throughout the data path. Such control is desired in both the transmit and receive directions of the radio.

The primary benefits of embodiments of the disclosed subject manner are manifold. First, a closed-loop operation of a radio throughout an unlimited spectrum of power levels is realized. Second, elimination of all calibration requirements and calibration components from the radio will result in significant cost savings. Third, utilization of low-power and low-frequency components in a high frequency and high power radio will reduce cost and complexity. And lastly, the desirable properties described above are actualized by enabling analog signal feedback while providing digital power level control.

Figure 3:
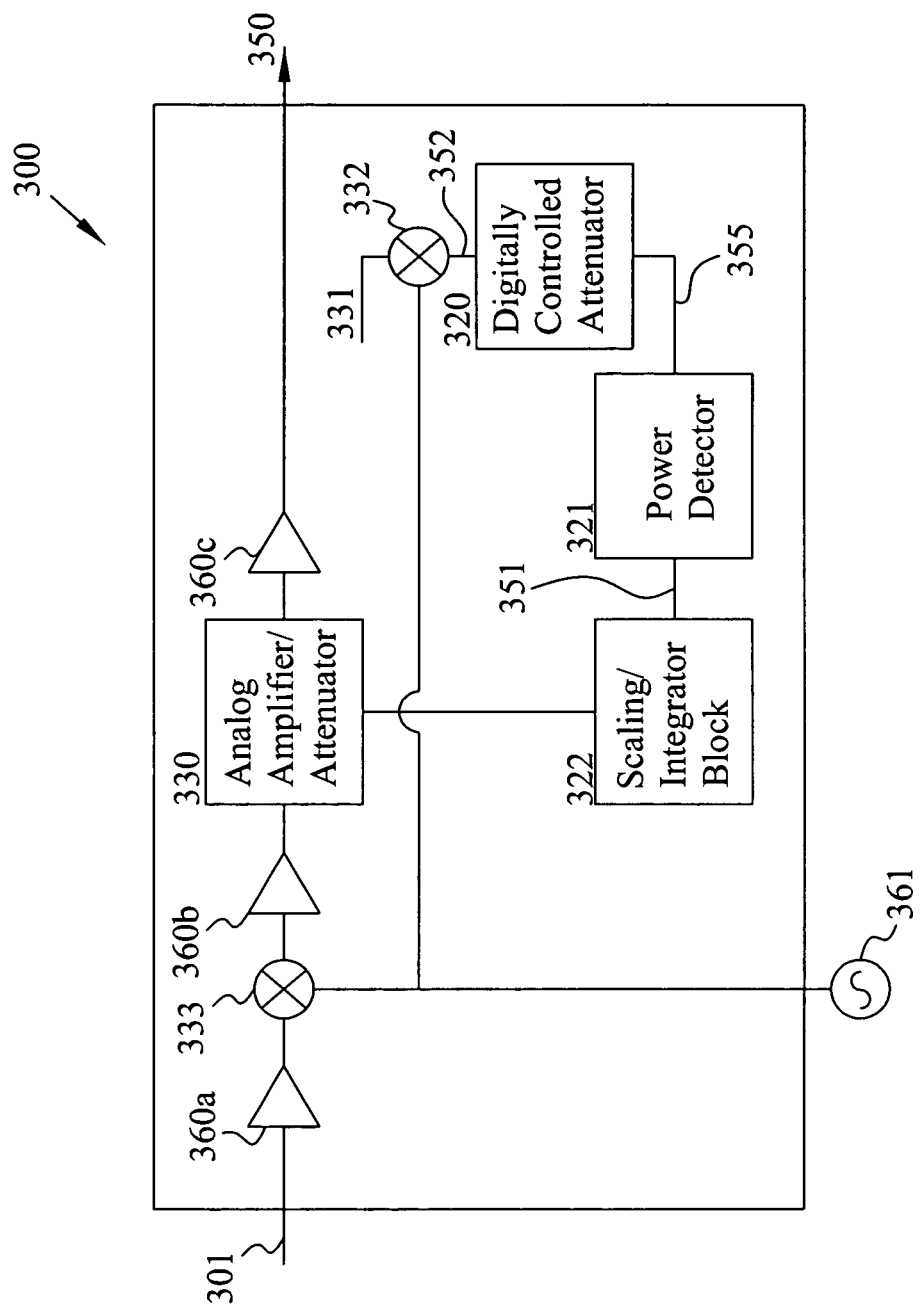
FIG. 3 is an embodiment of a digitally controlled analog feedback loop.

FIG. 3 is a block diagram describing the final stage 300 of a microwave radio. The maximum output power is 32 dBm. The digitally controlled attenuator 320 has 32 dB of range. In this example, the analog amplifier is an attenuator; however operation as an amplifier is equally envisioned. In this disclosure amplification and amplify is meant to represent changing signal power levels either amplification or attenuation (up or down) while attenuation retains its common meaning of reducing the power level. The power detector 321 and scaling/integrator block 322 stabilizes at 0 dBm at the output of the digitally controlled attenuator 320. Loss at the coupler and down-converter are ignored for illustration purposes.

For a desired power level at the coupler 331 of 32 dBm, 32 dB of attenuation is applied to the digitally controlled attenuator 320. When the power level at coupler 331 falls below the target power level of 32 dBm, the power level at the output of the attenuator 320 drops below 0 dBm. This results in a lower output voltage from the power detector 321 and a decrease in the voltage applied to the analog amplifier (attenuator) 330. The ultimate result is less attenuation in the signal path such that the target power level of 32 dB at the output 350 is re-attained.

If an output power level of 10 dBm is desired, 10 dB is applied to the digital attenuator 320. The immediate result of this application is saturation of the power detector 321 because the output of the digitally controlled attenuator is at 22 dBm. This causes the scaling/integrator (smoothing function) block 322 to adjust the voltage at the control signal until the attenuation thus applied to the analog amplification device 330 results in 0 dBm at the output of the digitally controlled attenuator 320. A level of 0 dBm at the attenuator 320 output corresponds to 10 dBm at coupler 331.

The down converter output 352 is a feedback signal that has been down-converted by the down converter 332 to at least the IF frequency. The digitally controlled attenuator output 355 is a feedback signal that has been both down-converted and attenuated. The power detector output 351 is a signal representative of the detected voltage and the scaling/integrator output is a smoothed control voltage signal that is applied to the data signal path 301-350.

Other portions of the final stage of a microwave radio as shown in FIG. 3 are typical gain states 360a-360c, frequency up-converter 333 and signal generator (synthesizer) 361.

Figure 4:
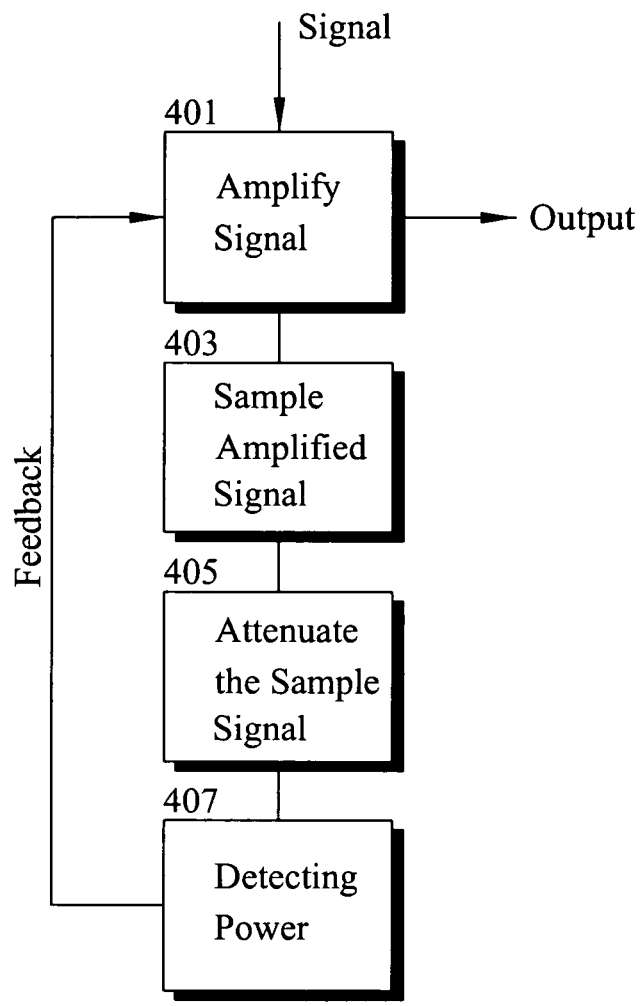
FIG. 4 is a method of amplifying a signal according to an embodiment of the present subject matter.

FIG. 4 is a representative flow chart for an embodiment of the present subject matter. The method includes amplifying a signal with an analog amplifier in response to an analog control signal as shown in block 401, sampling the amplified signal shown in block 403 and attenuating the sampled signal with a digitally controlled attenuator as shown in block 405. The method then proceeds with detecting the power in the attenuated signal sample as shown in block 407 and outputting an analog control signal based the detected power. The attenuation is a function of the power level of the amplified signal and a user selected set point. In some embodiments, the digital signal attenuator comprises and adjustable set point for attenuating the amplified output signal.

Additional embodiments of the present subject matter may include smoothing the detected power in creating the analog control signal, as exemplified by the scaling integrator block 322 of FIG. 3. Embodiments may also include the steps of up converting the signal prior to amplification and down converting the signal to at least an intermediate frequency.

While preferred embodiments of the present invention have been described, it is to be understood that the embodiments described are illustrative only and that the scope of the invention is to be defined solely by the appended claims when accorded a full range of equivalence, many variations and modifications naturally occurring to those of skill in the art from a perusal hereof.

I claim:

1. A method of controlling signal amplification, comprising:

amplifying a signal with an analog amplifier;
sampling the amplified signal to obtain a signal sample;
down converting the signal sample prior to attenuation with a digitally controlled attenuator;
attenuating the signal sample with the digitally controlled attenuator;
detecting power of the attenuated signal sample;
smoothing the detected power of the attenuated signal sample; and
controlling the analog amplifier with the smoothed detected power of the attenuated signal sample;
wherein the attenuation is a function of a power level of the amplified signal and a user selected set point.

2. The method of claim 1, further comprising up converting the signal prior to amplification.

3. The method of claim 1, further comprising supplying a desired power output set point to the digitally controlled attenuator.

4. The method of claim 1, wherein the amplification comprises attenuation.

5. The method of claim 1, wherein the digitally controlled attenuator is software controlled.

6. A digitally controlled analog feed back loop for an analog signal amplifier comprising:
- a signal sampler operably coupled to an analog signal amplifier to sample an output signal of the analog signal amplifier;
- a frequency down converter operably coupled to the analog signal amplifier to provide a high-power, low-frequency sampled signal, prior to attenuation by the digitally controlled attenuator;
- a digitally controlled attenuator with a user defined set point operably coupled to the signal sampler for attenuating the sampled signal;
- a power detector operably coupled to the digitally controlled attenuator for detecting power of the attenuated sampled signal and generating an analog power control signal based on the detected power; and
- an integrator operably coupled to the power detector for smoothing the analog power control signal;
- wherein amplification by the analog signal amplifier is controlled by the smoothed analog power control signal, the smoothed analog power control signal being received by the analog signal amplifier from the integrator.

7. The feed back loop of claim 6, further comprising at least one frequency up converter operably coupled to an input terminal of the analog signal amplifier, wherein the frequency up converter outputs the signal for amplification.

8. The feed back loop of claim 6, wherein the analog signal amplifier is an analog attenuator.

9. The feedback loop of claim 6, wherein the power detector is a temperature compensated power detector.

10. A radio comprising:
- a signal path comprising an analog amplifier between a signal input terminal and amplified signal output terminal, the analog amplifier for generating an amplified output signal in response to a smoothed analog power control signal;
- a feedback path comprising:
  - a coupler in electromagnetic contact with the amplified signal output terminal for sampling the amplified output signal;
  - a frequency down converter operably coupled to the coupler for providing a high-power, low-frequency sampled signal, prior to attenuation by the digitally controlled attenuator;
  - a digitally controlled attenuator with a user defined set point for attenuating the down-converted amplified output signal;
  - a power detector for detecting power of the attenuated output signal and generating an analog power control signal based on the detected power; and
  - an integrator for smoothing the analog power control signal to output the smoothed analog power control signal to the analog amplifier of the signal path.

11. The radio of claim 10, wherein the signal path further comprises a demodulator for demodulating the amplified output signal.

12. The radio of claim 10, wherein the signal path further comprises a modulator for modulating the amplified output signal.

13. The radio of claim 10, wherein the signal path further comprises a frequency up converter.

* * * * *